April 20, 1948. A. ALFORD Re. 22,993

MATCHING NETWORK

Original Filed Nov. 19, 1936 3 Sheets-Sheet 1

INVENTOR
ANDREW ALFORD

BY E. D. Phinney
ATTORNEY

MATCHING NETWORK

Original Filed Nov. 19, 1936 3 Sheets-Sheet 2

INVENTOR
ANDREW ALFORD
BY E. D. Phinney
ATTORNEY

INVENTOR
ANDREW ALFORD

BY E. D. Rhinney
ATTORNEY

Reissued Apr. 20, 1948

Re. 22,993

UNITED STATES PATENT OFFICE 22,993

MATCHING NETWORK

Andrew Alford, Cambridge, Mass., assignor to Mackay Radio and Telegraph Company, New York, N. Y., a corporation of Delaware Original No. 2,165,086, dated July 4, 1939, Serial No. 111,643, November 19, 1936. Renewed December 21, 1938. Application for reissue March 19, 1945, Serial No. 583,401

13 Claims. (Cl. 178—44)

This invention relates to matching networks and pertains more particularly to networks of this character for interconnecting radio apparatus with two-wire transmission lines.

It is an object of this invention to provide an electrical network for interconnecting a radio transmitter with a two-wire transmission line so that it will always be insured that the two conductors of the transmission line carry equal currents 180° out of phase.

Another object is the provision of an electrical network for interconnecting a radio translating device with a two-wire circuit whereby equal voltages between the two wires of the circuit and the ground will be obtained and at the same time a 180° phase relation between the currents in the two wires will result.

Whenever two-wire transmission lines are used to supply power to the transmitting antennae, it is necessary to insure that the two conductors of the transmission line carry equal currents 180° out of phase so that the transmission line itself will not act as an antenna and radiate energy in all directions. When the currents in the transmission line are characterized as above mentioned, the line acts merely as a conductor to transfer the energy to the antenna, and undesirable radiation from the transmission line itself is avoided.

Transmission lines can very well be balanced at the lower radio frequency ranges by the use of known apparatus and methods with satisfactory results, but as the frequency is increased difficulties are encountered which have not been overcome by the teachings of the prior art. For example, with frequencies of the order of five megacycles the problem of supplying the line with energy in a balanced manner may be satisfactorily solved by a number of methods employing air core transformers.

At frequencies of the order of ten megacycles some difficulty is encountered since an ordinary air core transformer tends to pick up energy through electrostatic coupling as well as electromagnetic coupling and therefore operates in a manner which cannot always be predicted with certainty, with the result that the voltages at the opposite ends of the output winding are neither necessarily equal nor 180° out of phase. At fifteen magacycles this condition is further emphasized since at this frequency electrostatic coupling is more efficient and exerts a greater disturbing effect. At all higher frequencies the difficulties encountered are even greater.

It has been suggested heretofore that in order to secure the balance desired as oulined hereinabove, the center of the secondary of the transformer be grounded so as to insure that the center of this coil shall be at zero potential. This condition is difficult to achieve however, since the grounding connection must necessarily have some physical length and consequently some inductance, this inductance being usually high enough so that the drop across the grounding wire at the higher frequencies is sufficient to produce a floating potential at the center of the coil instead of a fixed ground potential, with the result that capacity coupling between the primary and secondary of the transformer results and produces the usual undesirable effect.

A large number of other arrangements have been suggested for obtaining a balanced condition in transmission lines, but so far as I am aware the various known arrangements are either extremely complicated and expensive to construct or fail to give a balanced output at the higher frequency ranges.

I have found that it is possible to avoid the difficulties due to capacity coupling by the provision of an electrical network which is relatively simple and has been found to give very satisfactory results in actual practice.

In accordance with my invention I provide a network of impedances connected across and in series with the line and between line and ground which serve to balance the line, causing it to have in the two wires thereof equal currents 180° out of phase with respect to each other whereby undesired radiation from the line is prevented. When the line is used in conjunction with a radio receiver it similarly is free from undesired pick-ups.

The above described and further objects and advantages of my invention and the manner of attaining them will be more fully explained in the following description taken in conjunction with the accompanying drawings.

In the drawings

Figure 1:
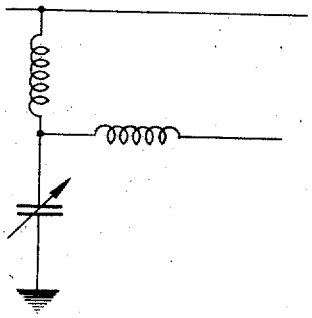
Fig. 1 illustrates a network forming one embodiment of my invention wherein two inductances and a condenser are used.
Figure 2:
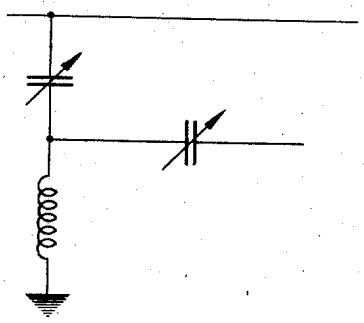
Figs. 2 and 3 illustrate other networks in accordance with my invention, utilizing two condensers and an inductance.
Figure 3:
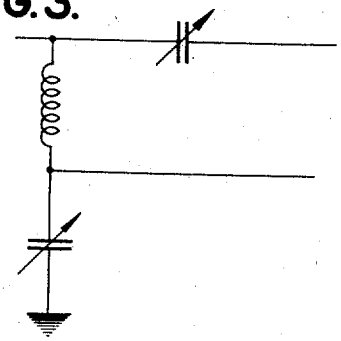
Figure 4:
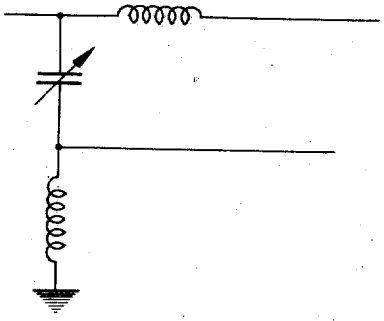
Fig. 4 illustrates another network in accordance with my invention utilizing two inductances and a condenser.
Figure 5:
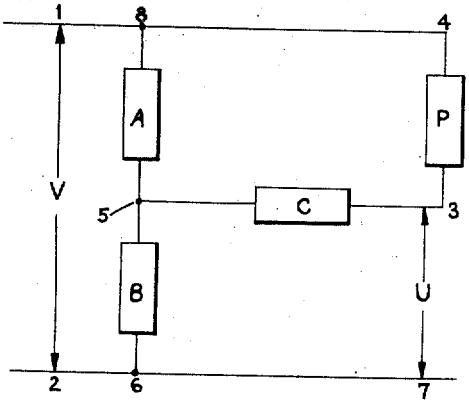
Figure 6:
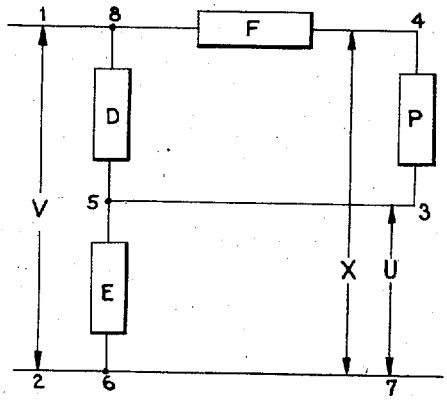

Figs. 5 and 6 are diagrams used in explaining the operation of the networks shown in Figs. 1 and 2, and in Figs. 3 and 4, respectively.

Figs. 7, 8, 9 and 10 show various circuit arrangements utilizing the networks of Figs. 1, 2, 3 and 4.

Figure 11:
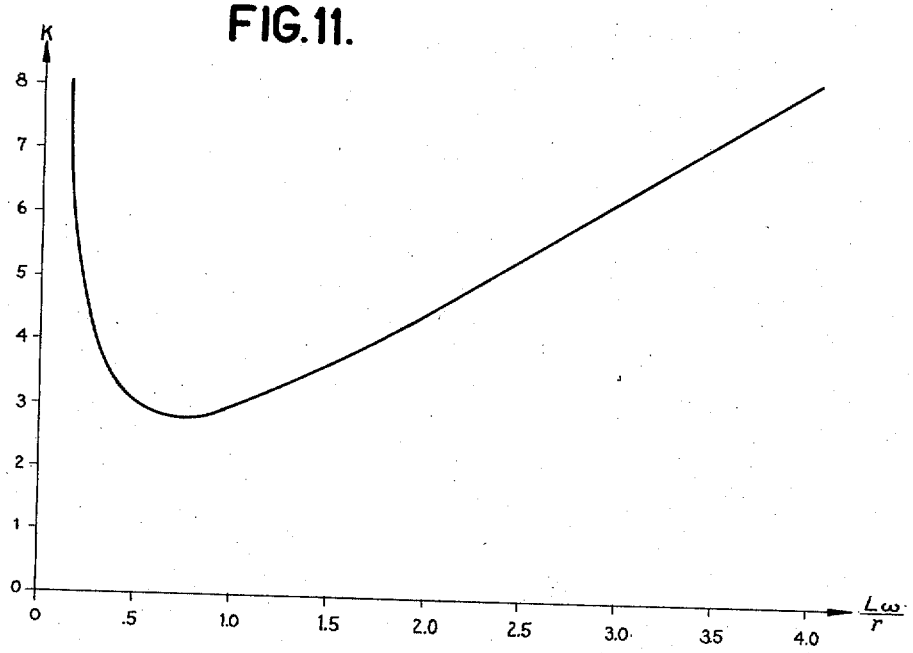
Figure 12:
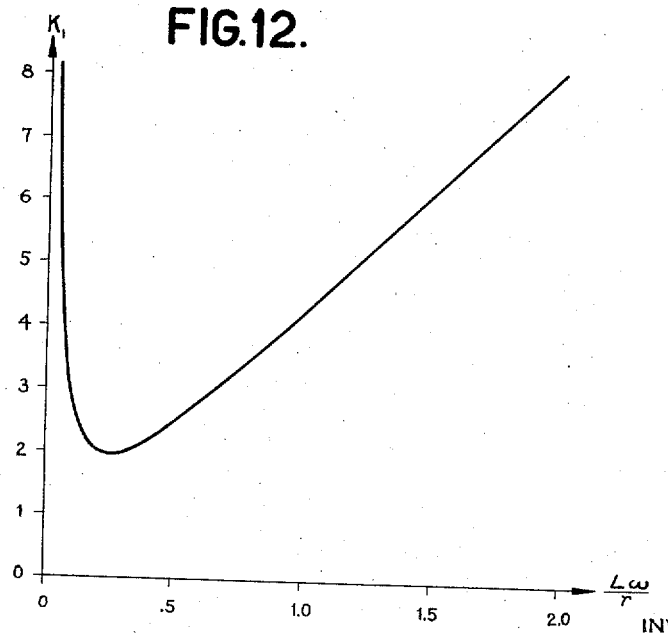

Figs. 11 and 12 are used in further explanation of the invention.

Referring more particularly to the drawings, in Fig. 5 the voltage between the wires 1—4, and 2—7, is V and the voltage between wire 2—7 and the point 3 is U, the wire 2—7 being connected to ground in such manner that it is really at ground potential or if not, so that it may be assumed to be at ground or other fixed potential. The impedance 8—5 is A, the impedance 5—6 is B, the impedance 3—5 is C and the impedance 3—4, representing the transmission line impedance is P. Likewise the current through the impedance A is M, and the current through the impedance P is N.

The power for supplying the currents mentioned, which may for example be derived from a vacuum tube, is assumed to be applied between terminals 1 and 2 while the transmision line, represented by impedance P, is connected to terminals 3 and 4.

Now the condition desired to be attained is that the voltage U between the point 3 and ground, and the voltage V between the point 4 and ground, shall be equal in magnitude and opposite in phase, that is V=−U.

This result is secured when the relative values and signs of the impedances are properly chosen as shown by the following formulae.

(1) $$V=-U$$

(2) $$V-U=NP$$

(3) $$2V=NP$$

(4) $$N(P+C)=AM$$

or (5) $$M=\frac{N}{A}(P+C)$$

(6) $$AM+(M+N)B=V=\frac{NP}{2}$$

expanding and rearranging terms (6) becomes (7) $$(B+A)M+\left(B-\frac{P}{2}\right)N=0$$

(8) $$(B+A)M=\left(\frac{P}{2}-B\right)N$$

by substituting (5) in (8) we get (9) $$(B+A)(P+C)\frac{N}{A}=\left(\frac{P}{2}-B\right)N$$

or

(10) $$(B+A)(P+C)=A\left(\frac{P}{2}-B\right)$$

Assuming that A, B and C are pure reactances or very nearly such, equal to $ja$, $jb$ and $jc$, respectively, and that P is expressed by $r+js$ then Equation 10 becomes

(11) $$(jb+ja)(r+js+jc)=ja\left(\frac{r}{2}+\frac{js}{2}-jb\right)$$

which may be expanded as

(12) $$jbr+jar-\frac{1}{2}jar-bc-ac^2-bs-as-ab+\frac{1}{2}as=0$$

Equating imaginary and real components separately we derive two separate Equations 13 and 14 as follows:

(13) $$(b+a)c+(b+a)s=-ab+\frac{1}{2}as$$

(14) $$jbr+jar=\frac{1}{2}jar \text{ or } b+a=\frac{1}{2}a$$

Now substituting $\left(\frac{1}{2}a\right)$ for $(b+a)$ in Equation 13 we obtain

(15) $$\frac{1}{2}ac+\frac{1}{2}as=-ab+\frac{1}{2}as$$

or

(16) $$c=-2b \text{ or } C=-2B$$

substituting 16 in 14 we derive

(17) $$a=c \text{ or } A=C$$

by comparison of 16 and 17 we get

(18) $$a=-2b \text{ or } A=-2B$$

Thus the condition that $V=-U$ regardless of the value of P may be satisfied by the two circuits shown in Figs. 1 and 2 provided that elements of the same kind, that is the two inductances in Fig. 1 and the two capacitances in Fig. 2 are equal, and when the third element is such that the impedance across it is equal in magnitude to one-half of the impedance of either one of the equal elements, and has an opposite sign. To assure this result the two inductances in Fig. 1 must be arranged in such manner as to avoid or at least keep very small, mutual reactance between them. And the third element must be arranged in such manner that the impedance from the junction point of the inductances in Fig. 1 to ground is equal in magnitude to one-half of the impedance of either one of the inductances, and is of opposite sign. But this impedance need not be necessarily concentrated in the third element itself, that is, it is not necessary that the condenser represented in Fig. 1 should have the exact value of impedance for, for instance, it is entirely possible for part of this impedance to be concentrated in the lead which is necessary to connect this condenser to ground so that in actual practice it may well be that the reactance of the condenser is actually much higher than that which is required; yet a part of it is balanced out by the reactance of the lead which connects the condenser to ground or for that matter partially by the inductance of the lead which connects the other side of the condenser to the junction point of the inductances.

The same, of course, is true of Fig. 2, namely this time the inductance shown as the third element is not necessarily concentrated in the coil itself but partially at least is to be found in the wire which connects this inductance to ground or to the junction point of the two condensers. It is this feature of the circuit which makes it really practical for with this circuit it is not necessary to find a point in the transmitter that is really at ground potential. Indeed all that is necessary is that the impedance between the junction point of the similar elements and ground have the required value. It has been found experimentally that the distributed capacity of the inductors to ground utilized in circuit 1 does not in practice disturb the circuit to any great extent. The same is true of the stray capacities to ground of the condensers utilized in circuit 2. This is quite reasonable from the theoretical point of view for the over all effect of such stray capacities to ground is merely to alter the impedance between points 3 and 4 respectively to ground, that is, in effect merely to alter the impedance of the transmission line as seen from terminals 3 and 4. We have already shown above that as long as the fundamental conditions of the circuit are satisfied it is quite immaterial as to what the impedance of the line happens to be for the conditions to be satisfied by the three elements are the same irrespective of the value of this impedance.

The circuits 3 and 4 may best be explained in connection with Fig. 6. This figure differs from Fig. 5 only in that an impedance has been placed between points 4 and 8 rather than between points 3 and 5. The analysis of this circuit is very similar to the one which has already been carried out in connection with Fig. 5.

Assuming that V represents the voltage between conductors 1—8 and 2—7; U the voltage between point 3 and ground, that is conductor 2–7 and X is the voltage between the point 4 and conductor 2—7, then for a condition of perfect balance we have $U=-X$.

This result is secured when the relative values and signs of the impedances are properly chosen as shown by the following formulae.

(19) $$U+X=0$$

(20) $$V=DM+E(M+N)$$

(21) $$\frac{DM}{F+P}=N$$

(22) $$U=(M+N)E$$

(23) $$X=NP+(M+N)E$$

adding Equations 22 and 23, we get

(24) $$X+U=NP+2(M+N)E$$

substituting 19 in 24, we get

(25) $$NP=-2ME-2NE$$

or collecting terms

(26) $$N(P+2E)=-2ME$$

substituting 21 in 26, we get

(27) $$(P+2E)D=-2E(F+P)$$

expanding, we get

(28) $$PD+2DE=-2EF-2EP$$

Now assuming that D, E and F are pure reactances equal to $jd$, $je$ and $jf$ respectively, and that P is equal to $r+js$, then

(29) $$jdr+2jer-ds-2de-2ef-2es=0.$$

Equating imaginary and real components separately we derive two separate equations 30 and 31, as follows:

(30) $$-ds-2de=2ef+2es$$

(31) $$jdr=-2jer \text{ or } d=-2e$$

Now substituting $-d$ for $2e$ in Equation 30, we obtain

(32) $$-ds+d^2=-df-ds$$

hence

(33) $$d=-f \text{ or } D=-F$$

Consequently the reactances F and D must be equal in magnitude and opposite in sign and reactance E must have one-half the value of reactance D and must equal in sign reactance F. The two possibilities are illustrated in Figs. 3 and 4.

Figure 7:
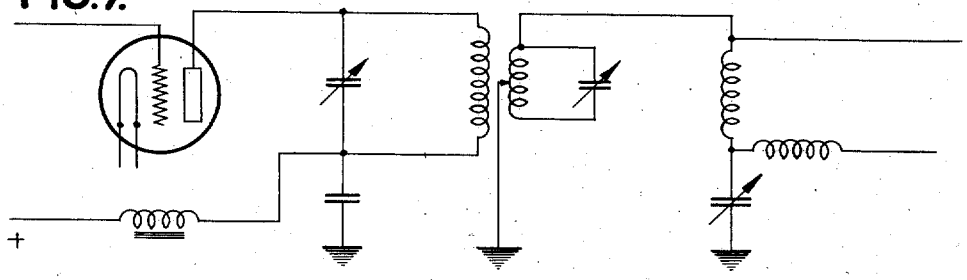
Figure 8:
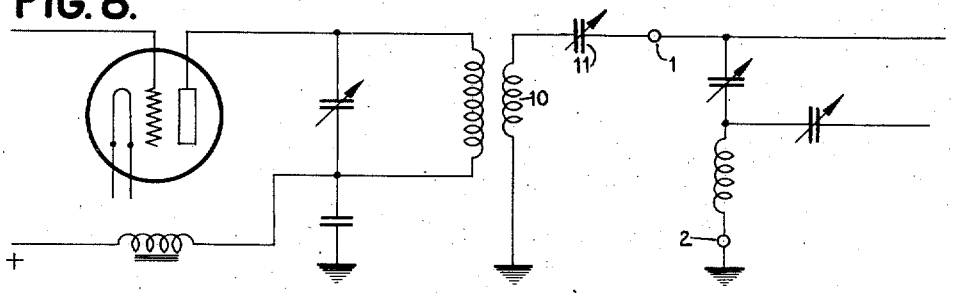

In actual practice it has been found convenient to connect circuits of the type illustrated in Figs. 1, 2, 3 and 4 to the tank circuit of the last amplifier stage in the transmitter in a manner shown in Figs. 7, 8, 9 and 10. The method shown in Fig. 7 when employed in connection with the circuit shown in Fig. 1 possesses the advantage that both conductors at the transmission line are connected directly to ground during the operation of the circuit so that any static charges which may accumulate on the antenna during rain or snow can leak off to ground whereby high static potentials may be avoided without the use of any auxiliary resistors or other means of grounding the transmission line. Moreover, the adjustments obtainable from this type of circuit are sufficient to take care of a fairly wide range of line impedances so that even when the transmission line is not flat, that is when it is not perfectly matched to the antenna, the tank circuit of the transmitter may still be properly loaded and the power transferred from the last amplifier to the transmission line in an efficient way. It has also been found in practice that the circuit shown in Fig. 8 is particuarly well adapted for use in conjunction with the circuit shown in Fig. 2 for in this case the impedance which is usually obtained between terminals 1 and 2 is capacitative so that part of the inductance 10 is already balanced out and condenser 11 may be fairly large and consequently the adjustments are not very critical and it is found that the tank circuit may be loaded with reasonable ease without the use of unreasonable capacities and inductances.

Figure 9:
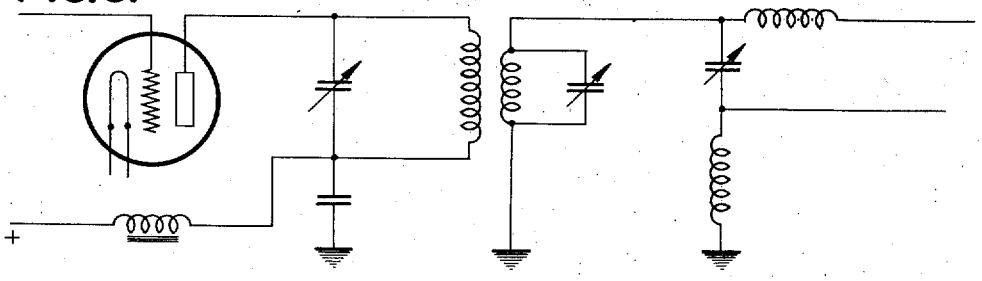
Figure 10:
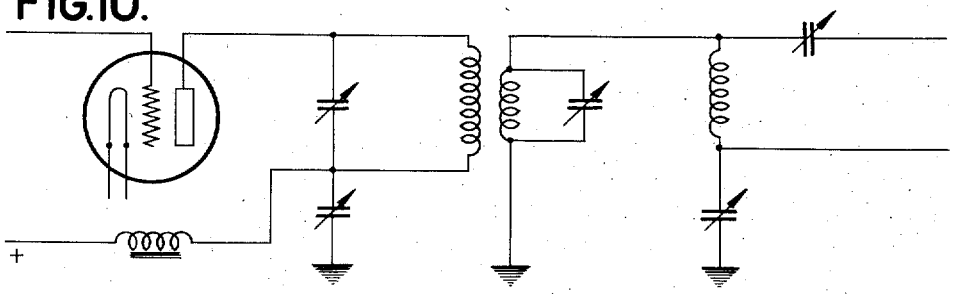

Either one of the circuits shown in Figs. 3 and 4 may be employed in connection with the arrangements shown in Figs. 7 and 8. The circuit shown in Fig. 9 may also be used in conjunction with any one of the four circuits shown in Figs. 1, 2, 3 and 4 when the impedance of the line is such that this circuit is more advantageous. Fig. 9 illustrates the connection when the circuit of Fig. 4 is employed, and Fig. 10 illustrates the connection when the circuit of Fig. 3 is used. The network components used for obtaining balance are in the circuits of Figs. 7, 8, 9 and 10 isolated from the high direct current potentials used on the plate of the last tube, by a transformer, usually of the step-down type, and therefore these components and especially the condensers may be relatively cheap in construction. The use of transformer coupling with grounded secondary reduces the danger of high direct current plate potentials reaching the line.

In order that the losses in the coils employed in any one of the four circuits described above may be kept low it is of course necessary to choose the proper values of inductances and capacitances.

An explanation will now be made as to how the values of inductance and capacitance can be determined for most efficient operation. This explanation will be made in connection with Figs. 1 and 2 since the method employed in connection with these circuits is applicable, with minor modification, to the other circuits.

It is well known that at the higher frequencies the losses are to be found mainly in the inductive reactors, namely coils, while the losses in condensers are comparatively low. Moreover, it is also quite well known that the losses in coils may be approximately determined from the so-called constant Q whose value is given by the equation $$Q=\frac{L\omega}{R} \tag{34}$$

where L is the inductance of the coil and $\omega=2\pi$ times the frequency.

The value of Q for ordinary transmitting coils is fairly well known and is usually somewhere around 150 or 200.

Upon the assumption that the Q factor and hence the resistance of the two coils of equal inductance, shown in Fig. 1, is the same the total loss H in both coils may be expressed by the formula $$H=(|M|^2+|N|^2)R \tag{35}$$

On the other hand W the power delivered to the line is $$W=|N|^2r \text{ or } |N|=\pm\sqrt{\frac{W}{r}} \tag{36}$$

Now if we assume that, as is usually the case, the impedance P of the transmission line is a pure resistance (i. e. if we assume that $js=O$ and $r=P$) and if we remember that $A=C$ (as shown by Equation 17) then we may write Equation 5 as follows:

$$M=N\left(\frac{r}{A}+1\right) \tag{37}$$

But since impedance $A=R+j\omega L$ and since this impedance is very nearly a pure reactance we may replace A by $j\omega L$ in Equation 37 thus giving $$M=N\left(\frac{r}{j\omega L}+1\right) \tag{38}$$

Substituting this in 35, we obtain $$H=R|N|^2\left(\frac{r^2}{L^2\omega^2}+2\right) \tag{39}$$

Now substituting 36 and 34 in 39 we get $$H=\frac{WL\omega}{Qr}\left(\frac{r}{L^2\omega^2}+2\right)=\frac{W}{Q}\left(\frac{r}{L\omega}+2\frac{L\omega}{r}\right) \tag{40}$$

now let $$\left(\frac{r}{L\omega}+2\frac{L\omega}{r}\right)=K \tag{41}$$

so that 40 may be written $$H=\frac{W}{Q}K \tag{40A}$$

Hence the loss H is the two coils depends upon the useful power W which in any given case is fixed, the factor Q of the coils which is made as large as possible, and the coefficient K which depends upon $$\frac{L\omega}{r}$$

as may be seen from the Equation 41.

Fig. 11 shows how the loss H in the two coils varies with the dimensions of the two coils, or rather, with the value of $$\frac{L\omega}{r}$$

From this figure is may be seen that the smallest value of K, that is the least losses for a given power output and a given Q factor, are obtained when $$\frac{L\omega}{r}$$

Is equal to .707. The value of K corresponding to such a value of $$\frac{L\omega}{r}$$

is 2.828. Therefore in this case $$H=\frac{2.828W}{Q}$$

From Fig. 11 it may be seen that the minimum is not at all sharp but there is a whole region where the losses are reasonably low. In actual practice, it is generally possible to design the circuit in such a manner that the circuit operates somewhere within this minimum loss region. It is quite obvious from Fig. 11 that small coils and large condensers are to be avoided in spite of the usual rule which is very often followed, namely, that for minimum loss small coils and large condensers are to be preferred. Fig. 11 definitely shows that this rule does not apply to the circuit shown in Fig. 1.

A similar calculation in connection with the circuit illustrated in Fig. 2 gives the following result:

$$H_1=\frac{W}{Q}\left(\frac{4L\omega}{r}+\frac{r}{4L\omega}\right) \tag{42}$$

Now let $$K_1=\left(\frac{4L\omega}{r}+\frac{r}{4L\omega}\right) \tag{43}$$

Then Equation 42 may be written as $$H_1=\frac{W}{Q}K_1 \tag{42A}$$

This result is illustrated in Fig. 12. From this figure again it may be seen that there is a certain best value of condensers and inductances to be used in this second circuit for minimum loss but again the region is fairly wide and in practice it is fairly easy to choose values of condensers and reactances which fall within the minimum loss region.

The smallest value of $K_1$ corresponding to the least losses for a given power output W and a given coil factor Q occurs when $$\frac{L\omega}{r}=.25$$

The value of $K_1$ for this condition is 2.00. It will be noted that this minimum value of $K_1$ is about 29 percent lower than the minimum value of K for the circuit of Fig. 1.

It may be pointed out that a circuit employing two condensers and reactor is somewhat more efficient from the point of view of loss than circuit 1 which employed two reactors and only one condenser. However, circuit 1 possessed other advantages. In practice, of course, the losses in circuit 1 are quite low so that very often other advantages of circuit 1 may out-weigh the low loss property of circuit 2. On the other hand, when the losses are the controlling feature and grounding is provided for in some other manner, circuit 2 may be preferred. The same sort of considerations apply to circuits illustrated in Figs. 3 and 4.

From the preceding description it will be seen that on the assumption that the impedances are pure reactances the balance of the line will not be affected by a change in the load. Furthermore even when the resistive components of the inductance coils used are taken into account from the standpoint of losses it will be noted that the power loss is not greatly affected by moderate changes in the load.

While I have described certain embodiments of my invention for the purposes of illustration, it will be understood that various modifications and adaptations thereof may be made within the spirit of the invention as set forth in the appended claims.

What I claim is:

1. An electrical network adapted to insure that currents traversing the two conductors of a two wire transmission line are of substantially equal magnitude and opposite phase comprising three reactances, two of which are of the same sign and the third of which is of the opposite sign, one of said three reactances being connected in series in one of said two wires, another in shunt to said two wires, and the third between one of said two wires and ground.

2. A system in accordance with claim 1 wherein the two reactances of the same sign are of equal value and the impedance of the third reactance is equal in magnitude to one-half that of either of said two reactances first mentioned.

3. An electrical network having two input terminals and two output terminals and adapted to maintain voltages equal in magnitude and opposite in sign, between each of said output terminals and a given one of said input terminals, comprising three reactances two of which are of the same sign and the third of which is of the opposite sign, the first of said three reactances being connected in series between an input terminal and an output terminal, a second of said reactances being connected between the same said input terminal and the other of said output terminals and the third of said reactances being connected between said other output terminal and the other of said input terminals.

4. An electrical network according to claim 3 wherein said first and said second of said reactances are of equal magnitude and opposite sign and said third reactance is of the opposite sign as said second reactance and of one half its value.

5. An electrical adapted to maintain equal voltages between each of two output temrinals and a given one of two input terminals comprising three reactances, a first and a second of the same sign and a third of the opposite sign, each having a first and a second terminal, all of said first terminals being connected together, the second terminals of said first and third reactances constituting said two input terminals and the second terminals of said first and second reactances constituting said two output terminals.

6. An electrical network in accordance with claim 5 wherein said first and second reactances are of the same sign and of equal magnitude and said third reactance is such that the impedance across it is equal in magnitude to one-half of the impedance of either said first or said second impedance and has an opposite sign.

7. In a radio system, radio translating apparatus including an amplifying tube, a two wire transmission line and means for inter-connecting said apparatus and said line so as to minimize energy transfer between said line and the surrounding space, comprising a network of three reactances, two of which are of the same sign and the third of which is of the opposite sign, one of said three reactances being connected in series in one of said two wires, another in shunt to said two wires, and the third between one of said two wires and ground, a tuned circuit coupled to the output circuit of said amplifying tube, and means connecting said tuned circuit across two of the reactances of said network.

8. In a radio system, radio translating apparatus including an amplifying tube, a two wire transmission line connected thereto, means for interconnecting said apparatus and said line so as to minimize energy transfer between said line and the surrounding space, comprising a network of three reactances, two of which are of the same sign and the third of which is of the opposite sign, one of said three reactances being connected in series in one of said two wires, another in shunt to said two wires, and the third between one of said two wires and ground, a first tuned circuit connected in the plate circuit of said amplifying tube, a second tuned circuit magnetically coupled to said first tuned circuit, means connecting said second tuned circuit across two of the reactances of said network, and means connecting to ground a point in said second tuned circuit.

9. An electrical network adapted to insure that currents traversing the two conductors of a two wire transmission line are of substantially equal magnitude and opposite phase comprising three reactances, a reactance of one sign being connected in series in one of said two wires, a reactance of the same sign being connected in shunt to said two wires and a reactance of the opposite sign being connected between said two wires and ground.

10. An electrical network adapted to insure that currents traversing the two conductors of a two wire transmission line are of substantially equal magnitude and opposite phase comprising three reactances, two of which are of the same sign and the third of which is of the opposite sign, a reactance of one sign being connected in series in one of said two wires, a reactance of the opposite sign being connected in shunt to said two wires and a third reactance having the same sign as said reactance of one sign connected between one of said two wires and ground.

11. An electrical network adapted to insure that currents traversing the two conductors of a two wire transmission line interconnecting a source and a load are of substantially equal magnitude and opposite phase comprising three reactances, two of which are inductive and equal in magnitude and the third of which is capacitative and has a magnitude equal to one-half that of either of said inductive reactances, one of the inductive reactances being connected in series in one of said two wires, the capacitative reactance being connected in shunt to said two wires and the other inductive reactance being connected between one of said two wires and ground, the impedance in ohms of each of said inductive reactances being equal to .707 times the resistance of said line together with said load.

12. An electrical network adapted to insure that currents traversing the two conductors of a two wire transmission line interconnecting a source and a load are of substantially equal magnitude and opposite phase comprising three reactances, two of which are capacitative and equal in magnitude and the third of which is inductive and has a magnitude equal to one-half that of either of said capacitative reactances, one of the capacitative reactances being connected in series in one of said two wires, the inductive reactance being connected in shunt to said two wires and the capacitative reactance being connected between one of said two wires and ground, the impedance in ohms of said inductive reactance being equal to .25 times the resistance of said line together with said load.

13. An electrical network having a first pair of terminals and a second pair of terminals and adapted to maintain voltages equal in magnitude and opposite in sign between each terminal of said first pair and a given terminal of said second pair, comprising three reactances two of which are of the same sign and the third of which is of the opposite sign, the first of said three reactances being connected in series between a terminal of said first pair and a terminal of said second pair, a second of said reactances being connected between the same said terminal of said first pair and the other of said terminals of said second pair, and the third of said reactances being connected between said other terminal of said second pair and the other terminal of said first pair.

ANDREW ALFORD.